(12) United States Patent
Alieu et al.

(10) Patent No.: US 6,812,113 B1
(45) Date of Patent: Nov. 2, 2004

(54) PROCESS FOR ACHIEVING INTERMETALLIC AND/OR INTRAMETALLIC AIR ISOLATION IN AN INTEGRATED CIRCUIT, AND INTEGRATED CIRCUIT OBTAINED

(75) Inventors: Jerome Alieu, Isle d' Abeau (FR); Christophe Lair, Brignoud (FR); Michel Haond, Crolles (FR)

(73) Assignee: STMicroelectronics SA, Montrouge (FR)

( * ) Notice: Subject to any disclaimer, the term of this patent is extended or adjusted under 35 U.S.C. 154(b) by 443 days.

(21) Appl. No.: 09/411,129

(22) Filed: Oct. 4, 1999

(30) Foreign Application Priority Data

Oct. 5, 1998 (FR) .............................. 98 12444

(51) Int. Cl.[7] ..................... H01L 21/76; H01L 21/4763; H01L 21/44; H01L 21/461; H01L 21/31
(52) U.S. Cl. ..................... 438/421; 438/422; 438/619; 438/624; 438/634; 438/752; 438/760
(58) Field of Search ................. 438/619, 624, 438/634, 760, 421, 422, 752

(56) References Cited

U.S. PATENT DOCUMENTS

| | | | | |
|---|---|---|---|---|
| 3,335,338 A | * | 8/1967 | Lepselter .................... 317/234 |
| 3,590,479 A | * | 7/1971 | Devries ........................ 29/578 |
| 3,765,969 A | * | 10/1973 | Kragness et al. ............. 156/17 |
| 4,771,013 A | * | 9/1988 | Curran ......................... 437/31 |
| 5,250,452 A | * | 10/1993 | Ozturk et al. ................. 437/41 |
| 5,291,053 A | * | 3/1994 | Pfiester et al. .............. 257/393 |
| 5,302,551 A | * | 4/1994 | Iranmanesh et al. ......... 437/195 |
| 5,372,969 A | * | 12/1994 | Moslehi ..................... 437/195 |
| 5,461,003 A | | 10/1995 | Havemann et al. ......... 437/187 |
| 5,510,645 A | * | 4/1996 | Fitch et al. ................. 257/522 |
| 5,571,744 A | * | 11/1996 | Demirlioglu et al. ......... 437/57 |
| 5,598,026 A | | 1/1997 | Kapoor et al. ............. 257/634 |
| 5,686,341 A | * | 11/1997 | Roesner ...................... 437/60 |
| 5,734,193 A | * | 3/1998 | Bayaraktaroglu et al. ... 257/579 |
| 6,028,348 A | * | 2/2000 | Hill ............................. 257/666 |
| 6,083,821 A | * | 7/2000 | Reinberg .................... 438/619 |
| 6,110,786 A | * | 8/2000 | Gardner et al. ............. 438/300 |
| 6,121,126 A | * | 9/2000 | Ahn et al. ................... 438/602 |
| 6,207,890 B1 | * | 3/2001 | Nakai et al. ................ 136/246 |
| 6,210,988 B1 | * | 4/2001 | Howe et al. ................. 438/50 |
| 6,246,096 B1 | * | 6/2001 | Krivokapic et al. ........ 257/412 |

* cited by examiner

*Primary Examiner*—Long Pham
*Assistant Examiner*—Shrinivas H Rao
(74) *Attorney, Agent, or Firm*—Allen, Dyer, Doppelt Milbrath & Gilchrist, P.A.; Lisa K. Jorgenson

(57) ABSTRACT

The device and process include the deposition of polycrystalline germanium in the interconnect spaces between conductive metal elements. The device and process further include the removal of the germanium in order to form air-filled interconnect spaces.

18 Claims, 6 Drawing Sheets

PROCESS FOR ACHIEVING INTERMETALLIC AND/OR INTRAMETALLIC AIR ISOLATION IN AN INTEGRATED CIRCUIT, AND INTEGRATED CIRCUIT OBTAINED

FIELD OF THE INVENTION

The present invention generally relates to the isolation of the conductive metal elements of various metallization levels of an integrated circuit, and more particularly to a process, using air, for achieving such isolation of the conductive metal elements of the integrated circuit. The invention also relates to an integrated circuit in which at least some of the conductive metal elements of the various metallization levels of the circuit are isolated from each other by air.

BACKGROUND OF THE INVENTION

The operating speed of an integrated circuit depends on its total capacitance (C). This total capacitance is made up of the capacitances of the semiconductor device (junction capacitance, gate-drain capacitance, etc.) and of the interconnect capacitance. The interconnect capacitance itself is made up of two capacitances, the capacitance between the conductive metal elements of the same metallization level, generally called the intrametallic capacitance, and the capacitance between conductive metal elements of two successive metallization levels of the integrated circuit, generally called the intermetallic capacitance.

The capacitance of the device and the interconnect capacitance respectively represent approximately 30% and 70% of the total capacitance of the integrated circuit. The advantage of reducing the larger of these two capacitances, i.e. the interconnect capacitance, is therefore immediately apparent. Moreover, the intrametallic capacitance is the largest component of the interconnect capacitance.

Air is the best known dielectric having the lowest dielectric constant, and consequently it would be desirable to be able to achieve intermetallic and intrametallic isolation in integrated circuits by via air. The article "Use of Gas as Low-k Interlayer Dielectric in LSI's: Demonstration of Feasibility", by M. B. Anand, Masaki Yamada and Hideki Shibata (I.E.E.E. Transactions on Electron Devices, Vol. 44, No. 11, November 1997), describes a process for achieving intrametallic air isolation.

According to this process, a layer of carbon is deposited by sputtering, on the insulating film separating two adjacent metallization levels. The carbon layer has a thickness equal to the desired thickness for the conductive metal interconnect elements. Next, the recesses intended to accommodate the conductive metal elements are formed in the carbon film and metal is then deposited in these recesses by chemical vapor deposition (CVD) or physical vapor deposition (PVD), after which the assembly is subjected to conventional chemical-mechanical polishing in order to produce the conductive metal interconnect elements in the recesses.

A thin layer of insulating material having a thickness of generally about 50 nm is then deposited over the entire surface, for example a film of silicon dioxide deposited by sputtering. Next, the assembly is subjected to an oven heat treatment in an oxygen atmosphere, typically at a temperature of approximately 450° C. The oxygen diffuses through the thin film of insulating material, reacts with the carbon and converts it into carbon dioxide so that the spaces between the conductive metal elements end up being filled with gas. The article further mentions that the process can also be used for achieving intermetallic and intrametallic isolation.

A major drawback of the process described in the above document is the use of carbon, since carbon in an unacceptable contaminant of the machines used for the fabrication of the integrated circuits. Another drawback of the process is that it requires oven heating in an oxygen atmosphere at a temperature as high as 450° C. in order to oxidize the carbon and convert it into $CO_2$, which may impair the integrity of the integrated circuit. Furthermore, in order to achieve air isolation, the $CO_2$ formed must diffuse through the thin layer of $SiO_2$, something which greatly impairs the efficiency of the process.

SUMMARY OF THE INVENTION

An object of the present invention is therefore to provide a process for achieving intermetallic and/or intrametallic air isolation in an integrated circuit which substantially eliminates the drawbacks of the prior art.

In particular, the process of the present invention avoids the use of carbon. An object of the present invention is also such a process which is simple and rapid and which does not run the risk of contaminating the machines used for the fabrication of the integrated circuits.

According to the invention, the above objectives are met by a process for achieving intermetallic and/or intrametallic air isolation of at least some of the conductive metal elements of the metallization levels of the integrated circuit, including the following steps:

a) the deposition of polycrystalline germanium in at least some of the interconnect spaces between the conductive metal elements; and b) the removal of the polycrystalline germanium in order to form air-filled interconnect spaces between the conductive metal elements.

Polycrystalline germanium is a notable material in the process of the present invention since germanium reacts strongly with oxygen or an oxidizing agent, at room temperature, to form easily-removable compounds, namely GeO, which is volatile, $GeO_2$, which dissolves in water, and $GeOH_4$, which dissolves in dilute acid. It is therefore extremely easy to remove the polycrystalline germanium via, for example, suitable oxygen chemistry, such as by dissolving it in water, hydrogen peroxide or dilute $H_2SO_4$ solutions, so as to leave only air in place of the germanium for the interconnect isolation.

This dissolution by appropriate oxygen chemistry has the advantage of being able to be carried out at room temperature. Of course, the process may be carried out a temperature above room temperature, but not generally exceeding 200° C., in order to speed up the process of removing the germanium. It is also possible to remove the germanium by an oxidizing plasma such as, for example, an oxygen or ozone plasma. Finally, germanium is not a unfavorable chemical element in the fabrication of integrated circuits and in silicon technology, since it is not a contaminant of silicon. However, if so desired, it is possible, before depositing the polycrystalline germanium, to deposit an insulating layer, for example of $SiO_2$, in order to protect the metal elements from direct contact with the germanium.

In a first preferred embodiment of the process of the invention, intrametallic air isolation between conductive metal elements of the same metallization level is achieved by the following steps:

(1) the deposition of polycrystalline germanium in the interconnect spaces between the metal elements;

(2) the deposition of a layer of an insulation material on the metal elements and on the polycrystalline germanium;

(3) the formation of a photoresist resin mask on the layer of insulation material;

(4) the anisotropic etching of the layer of insulation material in order to form apertures in this layer which are opposite the polycrystalline germanium; and (5) the removal of the polycrystalline germanium in order to produce air-filled interconnect spaces.

Once the polycrystalline germanium has been removed, a layer of an insulating encapsulation material may be deposited in order to close off the air-filled interconnect spaces. As a variation, some of the interconnect spaces may be filled with the insulating encapsulation material or with another solid insulating material.

In a second preferred embodiment of the process of the invention, intermetallic and intrametallic air isolation between at least some of the conductive metal elements of the metallization levels of an integrated circuit is achieved by the following steps:

(1) the deposition of polycrystalline germanium between and on the conductive metal elements of a metallization level;

(2) the formation, for this metallization level, of the desired metal vias, this formation of the vias having the result of leaving a layer of insulating material on the surface of the deposited layer of polycrystalline germanium;

(3) the formation of the conductive metal elements of an adjacent metallization level on the surface of the layer of insulating material covering the deposited layer of germanium;

(4) the etching of the layer of insulating material covering the surface of the deposited layer of germanium in order to expose the deposited layer of germanium at selected places between the metal elements of the adjacent metallization level;

(5) the repetition of steps (1) to (4) until the desired number of metallization levels has been obtained, so as to obtain a stack of the desired number of metallization levels, in which stack the deposited layers of germanium form a mass of germanium that is uninterrupted as far as the surface of the stack; and (6) the removal of the uninterrupted mass of germanium in order to form air-filled interconnect spaces.

In a third preferred embodiment of the process of the invention, intermetallic and intrametallic air isolation between at least some of the conductive metal elements of the metallization levels of an integrated circuit is achieved by the following steps:

(1) the deposition of polycrystalline germanium between and on the conductive metal elements of a metallization level;

(2) the formation, for this metallization level, of the desired metal vias, this formation of the vias having the result of leaving a layer of insulating material on the surface of the deposited layer of polycrystalline germanium;

(3) the formation of the conductive metal elements of an adjacent metallization level on the surface of the layer of insulating material covering the deposited layer of germanium;

(4) the etching of the layer of insulating material covering the surface of the deposited layer of germanium in order to expose the deposited layer of germanium at selected places between the metal elements of the adjacent metallization level;

(5) the removal of the germanium in order to form air-filled interconnect spaces in the metallization level;

(6) the deposition of an intermetallic layer of insulating material in order to close off the air-filled interconnect spaces of the metallization level; and (7) the repetition of steps (1) to (6) until a stack of the desired number of metallization levels having air-filled interconnect spaces is obtained.

BRIEF DESCRIPTION OF THE DRAWINGS

The detailed description refers to the accompanying figures in which.

DETAILED DESCRIPTION OF THE PREFERRED EMBODIMENTS

Figure 1A:
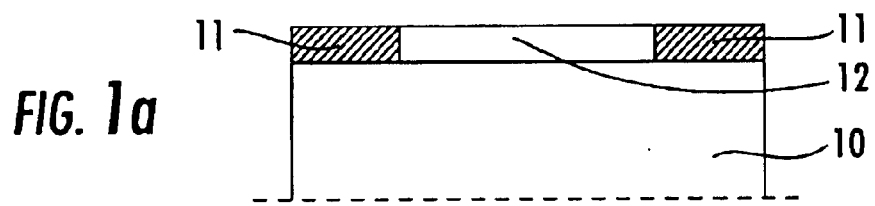
FIGS. 1a to 1f diagrammatically show the basic steps in achieving intrametallic air isolation according to the process of the invention.

Referring to FIGS. 1a to 1f, an application of the process of the invention to achieve intrametallic air isolation will now be described. After having conventionally formed the conductive metal elements 11 on a substrate 10, which may be a silicon semiconductor substrate covered with a layer of a configured insulation (contacts or vias) or a metallization level of an integrated circuit covered with a layer of a configured insulation (contacts or vias), the process starts, as shown in FIG. 1a, with the deposition, for example by chemical vapor deposition, of a layer of germanium and with the chemical-mechanical polishing of this layer in order to fill the interconnect spaces between the metal elements 11 with polycrystalline germanium 12.

Optionally, before the polycrystalline germanium 12 is deposited, a thin protective film, such as a film of $SiO_2$ from 5 to 50 nm in thickness, typically about 20 nm in thickness, may be deposited on the conductive metal elements 11 and on the exposed surface of the substrate 10. The deposition of this protective film may be carried out in any conventional manner, for example by CVD or PVD. A purpose of this protective film is to protect the metal elements 11 during the subsequent steps of producing the integrated circuit. The presence of this protective oxide film also allows the chemical-mechanical polishing of the deposited polycrystalline germanium to be carried out in a conventional manner, the operation stopping at the oxide layer.

Figure 1B:
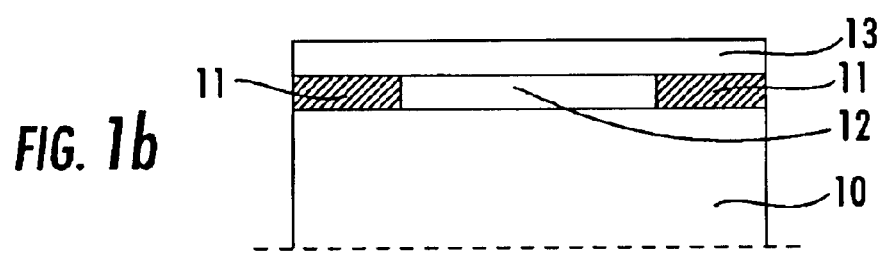
Figure 1C:
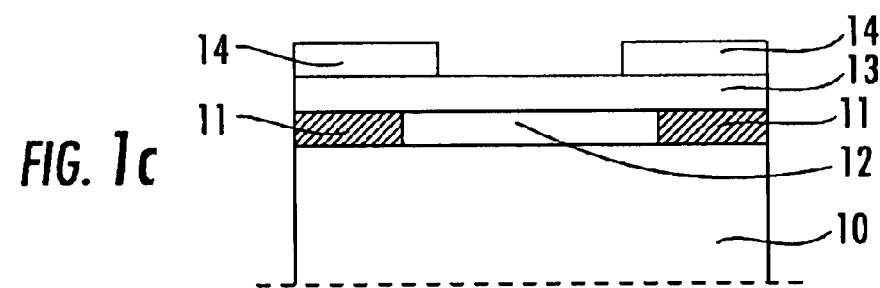
Figure 1D:
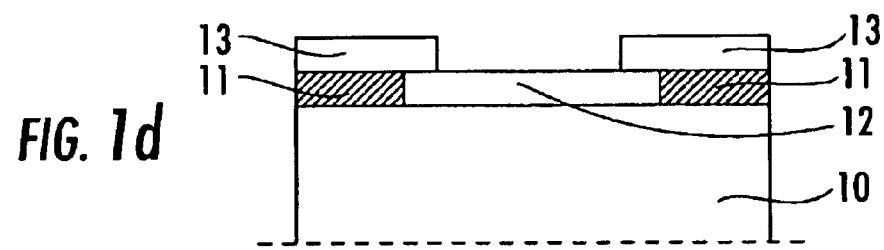

Next, as shown in FIG. 1b, a thin film of insulating material 13, for example a thin film of $SiO_2$ deposited by CVD, is deposited in a conventional manner so that this film covers the metal elements 11, which may already be coated with a protective oxide film, and the polycrystalline germanium 12 deposited in the interconnect spaces. Next, a mask of a photoresist resin 14 is formed, again in a conventional manner, on the film of insulating material 13 (FIG. 1c). As shown in FIG. 1d, the process continues with the etching of the insulating film 13, for example using conventional anisotropic etching of an $SiO_2$ film, and with the likewise conventional removal of the photoresist resin mask 14. The etching of the insulating film 13 leads to the formation of a recess which exposes the polycrystalline germanium 12 between the metal elements 11.

Figure 1E:
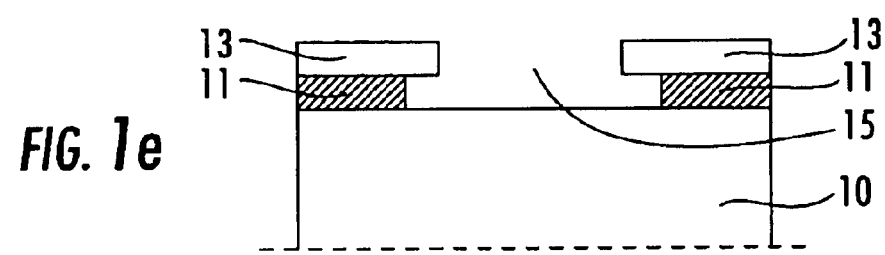
Figure 1F:
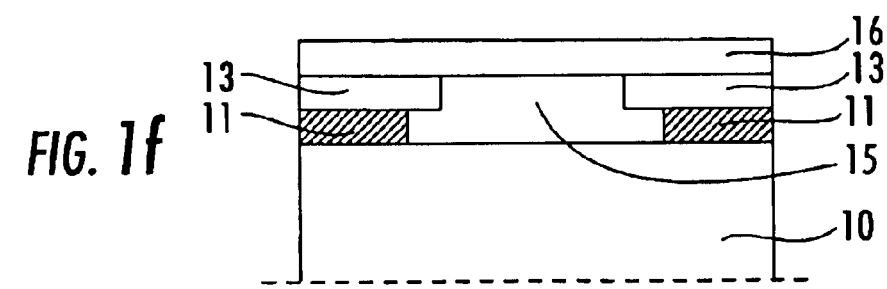

As shown in FIG. 1e, the process then continues with the removal of the germanium, for example by the action of an oxidizing solution, such as water, a hydrogen peroxide solution or a dilute sulphuric acid solution. Also, the germanium could be removed via an oxidizing plasma, such as an oxygen or ozone plasma. The germanium is removed in order to obtain an air-filled interconnect space 15. It is not necessary to remove the photoresist resin mask 14 before removing the polycrystalline germanium 12, but this removal of the photoresist resin could be carried out equally well after the polycrystalline germanium has been removed or simultaneously with its removal. The resin may be removed in a conventional manner, for example via an oxygen or ozone plasma. Next, a film of insulation 16, for example a thin film of $SiO_2$, of SiOF or of silsesquioxane hydride (SQH), is deposited and annealed in a conventional manner, as shown in FIG. 1f.

The fabrication of the integrated circuit may then be continued in a conventional manner, for example by the deposition and chemical-mechanical polishing of an encapsulation layer, such as a layer formed from tetraethyl orthosilicate (TEOS), and then by carrying out further conventional steps. In order to prevent the interconnect space 15 from being filled with the material of the thin film of insulation 16 and of the encapsulation layer, either the viscosity of the deposition compositions may be adjusted or the sides of the etched apertures may be adjusted. Thus, with etched apertures having a size of at most 0.2 µm, the materials of the subsequent layers are prevented from filling the interconnect spaces.

Achieving hybrid isolation, using air and a solid insulating material, according to the process of the invention will now be described in conjunction with FIGS. 2a to 2d. As described above, the process may start with the deposition of a thin protective layer, for example made of silicon oxide, on the metal elements 11, and then continues with the deposition of a layer of polycrystalline germanium and with the chemical-mechanical polishing of this layer. The operation optionally stopping at the oxide when the protective silicon oxide layer is present, in order to fill the interconnect spaces between the metal elements 11 with polycrystalline germanium 12. Also, as discussed previously, and as shown in FIG. 2a, a thin film of insulating material 13, for example a thin film of silicon oxide, followed by a photoresist resin mask 14, having apertures 14a, 14b of different sizes, are then formed in succession.

Figure 2A:
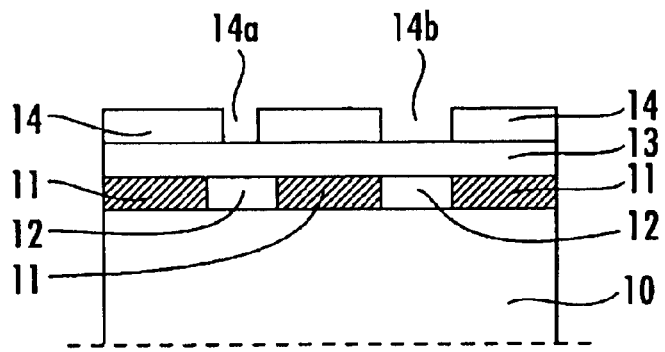
FIGS. 2a to 2d diagrammatically show the basic steps in achieving hybrid intrametallic isolation using air and a conventional solid insulation material.
Figure 2B:
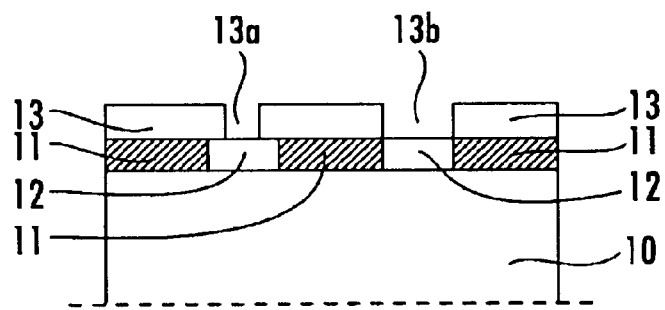
Figure 2C:
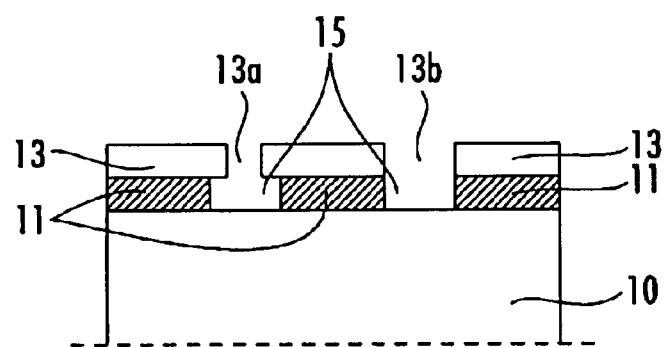

As previously discussed, the process then continues with the etching of the thin film of silicon oxide 13 and with the removal of the photoresist resin mask 14 so as to form, in the thin film of silicon oxide 13, apertures of different sizes 13a and 13b opposite the polycrystalline germanium deposited between the conductive metal elements 11 (FIG. 2b). Thus, for example, the aperture 13a may have a very small size ($\leq 0.2$ µm) and the aperture 13b may have a relatively large size (>0.2 µm). As shown in FIG. 2c, the polycrystalline germanium is then removed, as set forth above. The removal of the photoresist resin mask could just as well be carried out after removal of the polycrystalline germanium, or simultaneously with it.

Figure 2D:
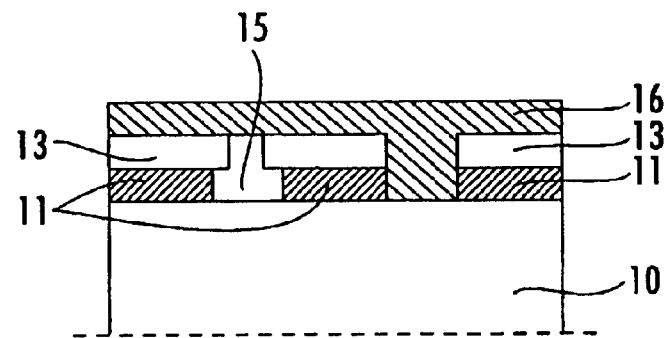

The process concludes with the conventional deposition and annealing of a layer 16 of insulating material, for example a layer of silicon oxide, of SiOF or of silsesquioxane hydride (SQH), which, as shown in FIG. 2d, because of the difference in size of the apertures 13a and 13b, does not penetrate into the smaller sized aperture 13a, thus closing off the interconnect space and achieving air isolation, whereas it does penetrate the larger aperture 13b and isolates the other interconnect space with a solid material, as may be seen in FIG. 2d. An encapsulation layer, for example of tetraethyl orthosilicate, is then generally conventionally deposited and subjected to chemical-mechanical polishing, and then the integrated circuit is completed in a standard manner.

Achieving intermetallic and intrametallic air isolation will now be described in conjunction with FIGS. 3a to 3i, 4a, 4b and 5a to 5d. As is well known, the necessary electrical connection between conductive metal elements of different metallization levels of an integrated circuit is achieved by "vias", i.e. metal-filled passages which electrically connect metal elements of one metallization level to the corresponding metal elements of an adjacent metallization level. The production of such vias in a process according to the invention will now be described in conjunction with FIGS. 3a to 3i.

Figure 3A:
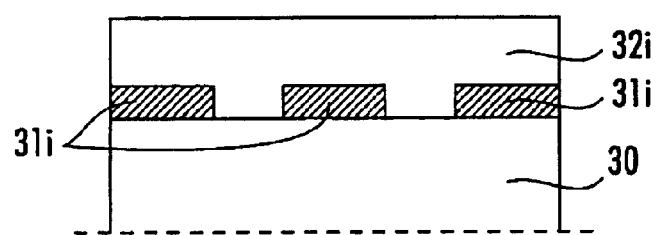
FIGS. 3a to 3i diagrammatically show the basic steps in forming vias in a process for achieving intermetallic and intrametallic air isolation according to the invention.

The production of vias according to the invention starts with the deposition of a layer 32i of polycrystalline germanium on the surface of a substrate 30 which may either be a semiconductor silicon substrate coated with a layer of configured insulation (contacts or vias) or a lower metallization level, and having conductive metal elements 31i (FIG. 3a). The polycrystalline germanium layer 32i may be deposited in a conventional manner by chemical vapor deposition, this being generally followed by a chemical-mechanical polishing operation. However, the deposited layer of polycrystalline germanium must be sufficiently thick to allow the production of vias between two successive metallization levels. That is to say that not only does the layer of polycrystalline germanium fill the interconnect spaces but that it covers the metal elements 31i with a thickness sufficient to be able to form vias, typically of about 1 µm, therein.

Figure 3B:
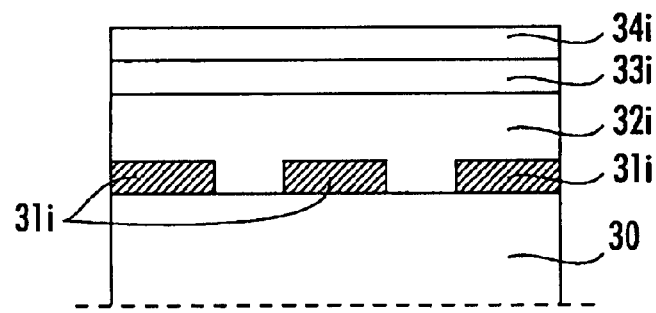
Figure 3C:
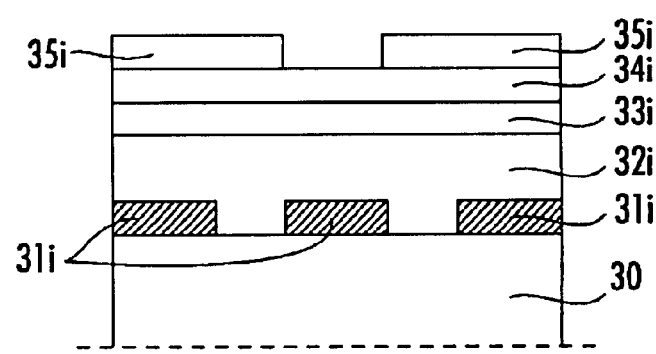
Figure 3D:
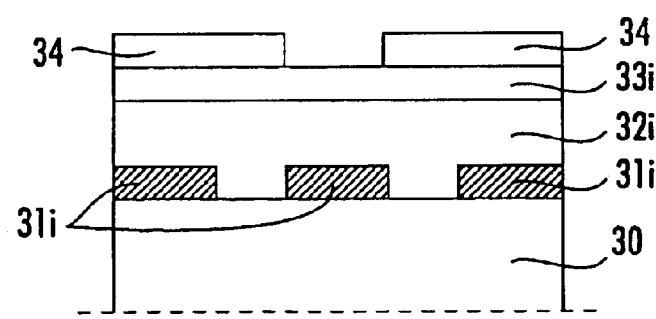

The process then continues, as shown in FIG. 3b, with the deposition of a stop layer 33i, for example a layer of silicon nitride ($Si_3N_4$), which may be deposited by plasma-enhanced chemical vapor deposition for example, and then with the deposition, in a conventional manner, of a layer 34i, for example, a layer of silicon oxide, serving for the formation of a hard mask. As shown in FIG. 3c, a photoresist resin mask 35i is then produced on the layer 34i. The layer 34i is then etched in a conventional manner, the operation stopping at the stop layer 33i, and the resin mask is removed in order to form a hard mask.

Figure 3E:
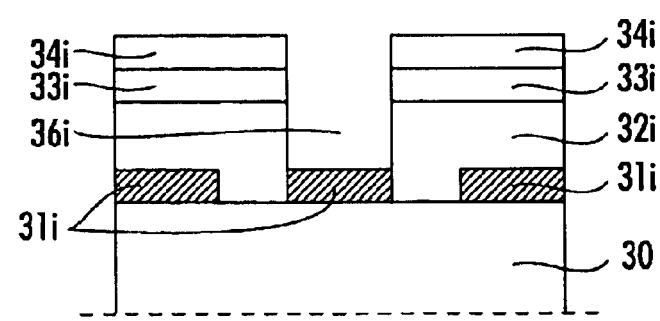
Figure 3F:
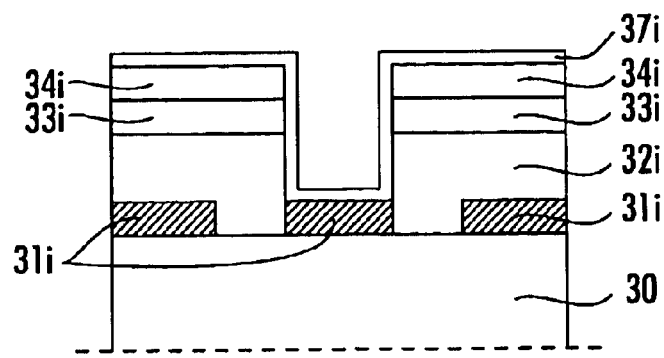
Figure 3G:
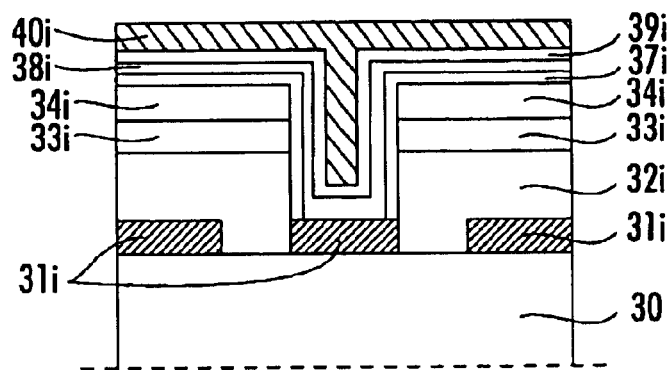

Next, as shown in FIG. 3e, the stop layer 33i and the germanium layer 32i are etched in order to form the passage or via 36i as far as the conductive metal element 31i. The process then continues in a conventional manner with the deposition of a layer 37i for protecting the via 36i, for example a thin layer of silicon oxide, then with the successive deposition of the via-protecting layers, for example a layer of titanium 38i, with a phase of etching away the oxide at the bottom of the via, and a layer of titanium nitride 39i, and finally the via is filled with metal, for example tungsten 40i (FIGS. 3f and 3g).

Figure 3H:
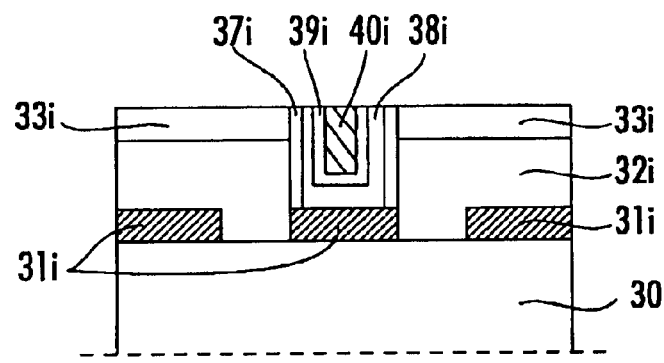
Figure 3I:
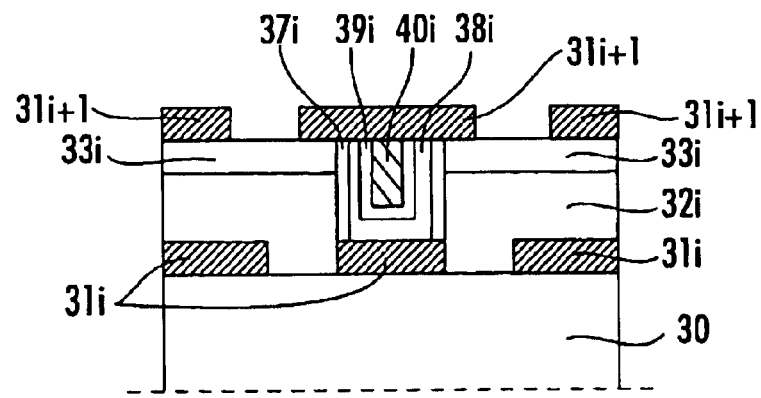
Figure 4A:
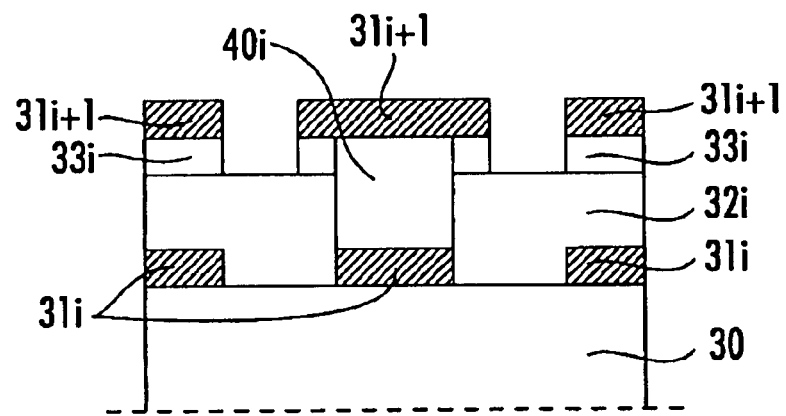
FIGS. 4a and 4b diagrammatically show the basic steps in achieving intermetallic and intrametallic air isolation, after the vias have been formed, according to a first embodiment of the process of the invention.
Figure 4B:
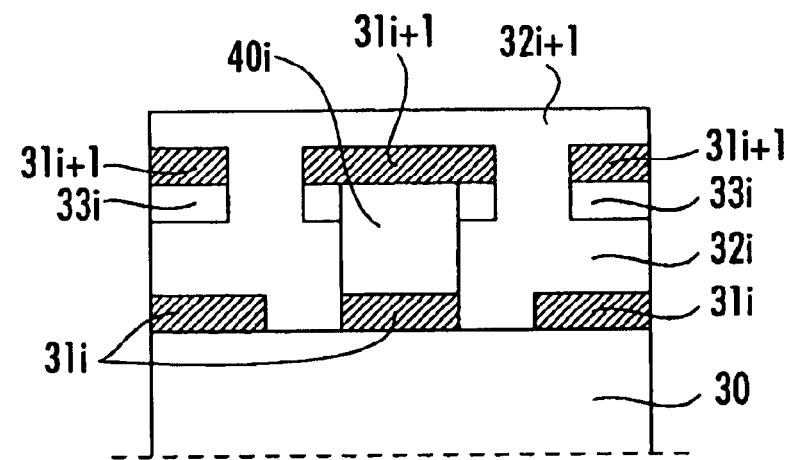

Then, as shown in FIG. 3h, the process continues with the chemical-mechanical polishing operation, which stops at the stop layer 33i so as to expose the metal-filled via 40i. Of course, the via-etching process used must allow anisotropic etching of polycrystalline germanium. One process for etching polycrystalline germanium includes the use of a high-density gas plasma using a mixture of gases—$Cl_2$ and either $N_2$ or $NH_3$, or an $N_2/NH_3$ mixture. As then shown in FIG. 3i, conductive metal elements 31i+1, of the metallization level i+1 immediately above, are produced in a conventional manner.

There are then at least two ways of producing the successive metallization levels and of achieving the air isolation according to the invention. In a first way, illustrated in FIGS. 4a and 4b, a step of etching the stop layer 33i of the metallization level i is carried out in order to expose the subjacent polycrystalline germanium 32i (FIG. 4a) and then a new layer of polycrystalline germanium 32i+1 for the metallization level i+1, similar to the layer of germanium 32i of the metallization level i, is deposited, by chemical vapor deposition as before. Then the vias for the upper level i+2 are formed, as indicated above. This operation is repeated as many times as necessary in order to obtain the desired number of metallization levels.

Once all the metallization levels have been formed, the deposited layers of polycrystalline germanium of all the metallization levels form a unitary mass as far as the final upper level, and the entire mass of germanium is removed in a single operation. This removal may be carried out, as previously, by oxidizing chemistry. The integrated circuit is then completed, for example by depositing an encapsulation layer on the final metallization level, thus achieving intermetallic and intrametallic air isolation of all the metallization levels.

Figure 5A:
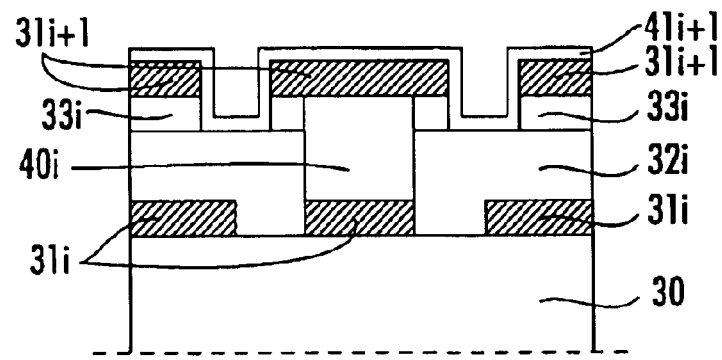
FIGS. 5a to 5d diagrammatically show the various steps in achieving intermetallic and intrametallic air isolation, after the vias have been formed, according to another embodiment of the process of the invention.
Figure 5B:
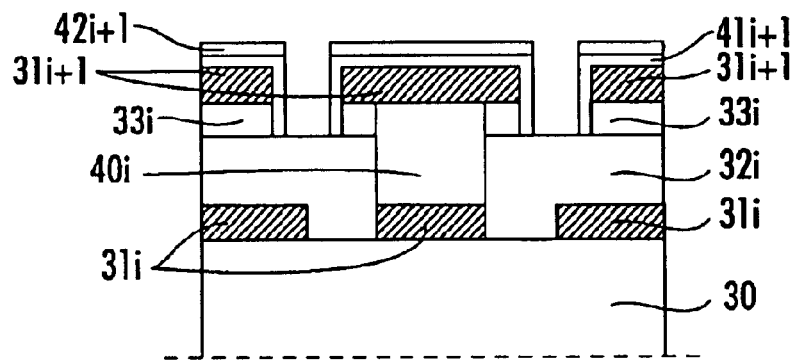
Figure 5C:
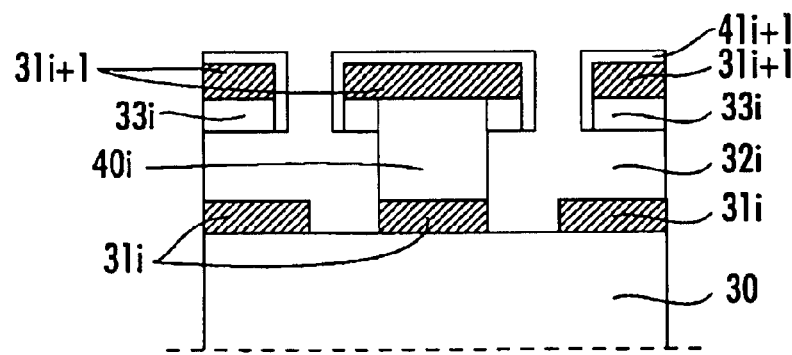
Figure 5D:
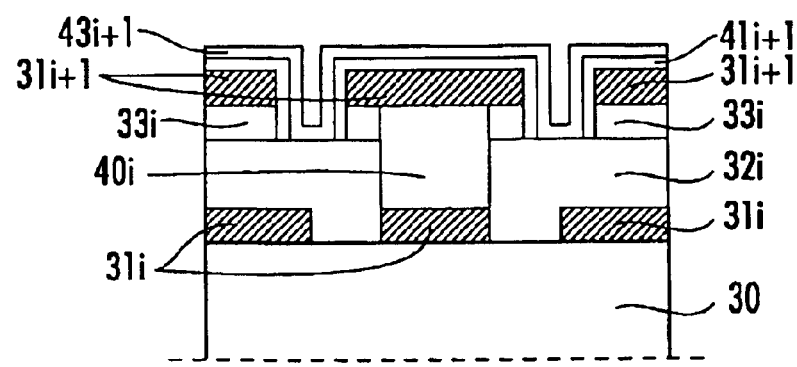

As a variation, as shown in FIGS. 5a to 5d, it is possible, after the stop layer 33i has been etched, to deposit a thin insulating layer, for example a layer 41i+1 of silicon oxide (FIG. 5a) and then to form, on this insulating layer, a resin mask 42i+1 and to etch the insulating layer in a conventional manner (FIG. 5b). At this stage, as shown in FIG. 5c, the process continues with the removal of the resin mask and the removal of the germanium. The process then continues, as shown in FIG. 5d, with the deposition of a protective layer 43i+1, for example of oxide, in order to close off the interconnect spaces and to achieve air isolation.

The process may then continue with the production of the metallization level i+2 by repeating the steps illustrated in FIGS. 3a to 3i of forming vias and the steps illustrated in FIGS. 5a to 5d of achieving air isolation. In this case, air isolation is achieved, metallization level by metallization level. Of course, in the example of the process illustrated in FIGS. 5a to 5d, hybrid isolation, using air and an insulating material, may be achieved as described previously.

What is claimed is:

1. A process for producing at least one air-filled region between a pair of conductive elements of an integrated circuit, comprising the steps of:
    depositing a sacrificial layer consisting essentially of polycrystalline germanium in at least one region between the pair of conductive elements; and
    removing the polycrystalline germanium to form the at least one air-filled region between the plurality of conductive elements.

2. A process according to claim 1, further comprising the step of depositing an insulating layer on the pair of conductive elements to prevent direct contact between the pair of conductive elements with the polycrystalline germanium.

3. A process according to claim 1, further comprising:
    depositing an insulating layer on the pair of conductive elements and on the polycrystalline germanium;
    forming a photoresist mask on the insulating layer; and
    anisotropically etching the insulating layer to form apertures therein which are opposite the polycrystalline germanium.

4. A process according to claim 3, further comprising removing the mask before, simultaneously with, or after removing the polycrystalline germanium.

5. A process according to claim 3, further comprising the step of depositing an insulating encapsulation layer on the insulating layer and over the at least one air-filled region in order to close off the at least one air-filled region.

6. A process according to claim 5, wherein the at least one air-filled region comprises a plurality of air-filled regions; and wherein the step of depositing an encapsulation layer includes filling some of the plurality of air-filled regions with an insulating encapsulation material.

7. A process according to claim 1, wherein the step of removing the polycrystalline germanium comprises the use of an oxygen plasma or ozone plasma.

8. A process according to claim 1, wherein the oxidizing solution is at least one of water, an aqueous hydrogen peroxide solution and a dilute aqueous $H_2SO_4$ solution.

9. A process according to claim 1, wherein the step of removing the polycrystalline germanium comprises the use of an oxidizing solution at a temperature range from room temperature to 200° C.

10. A process for fabricating an integrated circuit including a plurality of metallization levels each having a plurality of conductive metal elements, the process comprising the steps of:
    forming a sacrificial layer consisting essentially of polycrystalline germanium layer by depositing polycrystalline germanium on and between the plurality of conductive metal elements of a first metallization level;
    forming metal vias for the first metallization level, including forming an insulating layer on the polycrystalline germanium layer;
    forming conductive metal elements of an adjacent metallization level on the insulating layer;
    etching the insulating layer to form exposed portions of the polycrystalline germanium layer between the conductive metal elements of the adjacent metallization level;
    forming a stack of metallization levels by repeating the above steps until a predetermined number of metallization levels is obtained, wherein deposited layers of polycrystalline germanium within the stack form a continuous mass of polycrystalline germanium to a surface of the stack; and
    removing the continuous mass of polycrystalline germanium to form air-filled regions.

11. A process according to claim 10, further comprising the step of depositing an insulating encapsulation layer on a surface of an outermost metallization level to close off the air-filled regions.

12. A process according to claim 10, wherein the step of removing the polycrystalline germanium comprises the use of an oxidizing solution at a temperature range from room temperature to 200° C.

13. A process according to claim 12, wherein the oxidizing solution is at least one of water, an aqueous hydrogen peroxide solution and a dilute aqueous $H_2SO_4$ solution.

14. A process according to claim 10, wherein the step of removing the polycrystalline germanium comprises the use of an oxygen plasma or ozone plasma.

15. A process for fabricating an integrated circuit including a plurality of metallization levels each having a plurality of conductive metal elements, the process comprising the steps of:

forming a sacrificial layer consisting essentially of polycrystalline germanium on and between the plurality of conductive metal elements of a first metallization level;

forming metal vias, for the first metallization level, including forming an insulating layer on the deposited polycrystalline germanium layer;

forming conductive metal elements of an adjacent metallization level on the insulating layer;

etching the insulating layer to form exposed portions of the deposited polycrystalline germanium layer between the conductive metal elements of the adjacent metallization level;

removing the polycrystalline germanium to form air-filled regions in the first metallization level;

depositing an intermetallic insulating layer to close off the air-filled regions of the first metallization level;

forming a stack of metallization levels by repeating the above steps until a predetermined number of metallization levels is obtained each having air-filled regions formed therein.

16. A process according to claim 15, wherein the step of removing the polycrystalline germanium comprises the use of an oxidizing solution at a temperature range from room temperature to 200° C.

17. A process according to claim 16, wherein the oxidizing solution is at least one of water, an aqueous hydrogen peroxide solution and a dilute aqueous $H_2SO_4$ solution.

18. A process according to claim 15, wherein the step of removing the polycrystalline germanium comprises the use of an oxygen plasma or ozone plasma.

* * * * *